United States Patent [19]

Okamoto

[11] Patent Number: 5,432,513
[45] Date of Patent: Jul. 11, 1995

[54] CODEC
[75] Inventor: Seiji Okamoto, Tokyo, Japan
[73] Assignee: Oki Electric Industry Co., Ltd., Tokyo, Japan
[21] Appl. No.: 302,235
[22] Filed: Sep. 8, 1994

Related U.S. Application Data

[63] Continuation of Ser. No. 24,341, Mar. 1, 1993, abandoned.

[30] Foreign Application Priority Data

Mar. 2, 1992 [JP] Japan .................. 4-044894

[51] Int. Cl.6 .............................. H03M 1/00
[52] U.S. Cl. ...................... 341/108; 375/219
[58] Field of Search ............ 341/108, 110, 126, 144, 341/155; 375/7, 106

[56] References Cited

U.S. PATENT DOCUMENTS

| | | | |
|---|---|---|---|
| 3,906,488 | 9/1975 | Suarez-Gartner | 341/108 |
| 4,291,298 | 9/1981 | Carbrey | 341/108 |
| 4,815,099 | 3/1989 | Shimatani et al. | 375/7 |
| 5,148,430 | 9/1992 | Kuranaga et al. | 370/100.1 |
| 5,252,972 | 10/1993 | Kawbara | 341/108 |
| 5,278,865 | 1/1994 | Amrany et al. | 375/7 |
| 5,315,622 | 5/1994 | Abbiate et al. | 375/106 |

OTHER PUBLICATIONS

"Nihon Kogyou Gijutsu Center", Keys To Design and Application of A/D and D/A Converters, The First Edition (May 31, 1985), pp. 177–180.

*Primary Examiner*—Howard L. Williams
*Attorney, Agent, or Firm*—Spencer, Frank & Schneider

[57] ABSTRACT

In a codec having a coding section A/D converting an analog signal into a digital signal, and a decoding section D/A converting a received digital signal into an analog signal, a decoding timing generating circuit (50) is provided to generate a D/A conversion timing signal (S50) on the basis of a clock signal (S30b) generated by a coding PLL circuit (30) and a reading completion signal (S61a) supplied from decoding controller (61). In synchronism with this signal (S50), a D/A converter 62 converts the digital signal Di read by the decoding controller 61, into an analog signal, and sends it to the decoding filter 63. The decoding filter (63) operates synchronism with the clock signal (S30b) generated by the coding PLL circuit (30) to filter the output of the D/A converter (62), and outputs it as the analog signal (Ao). The S/N ratio due to asynchronous noises is improved, and the size, complexity, and the power consumption of the overall circuit are reduced, so the codec is suitable for implementation in an integrated circuit.

12 Claims, 5 Drawing Sheets

CODEC

This application is a continuation of application Ser. No. 08/024,341, filed Mar. 1, 1993 now abandoned.

BACKGROUND OF THE INVENTION

The present invention relates to a codec which converts an analog signal to a digital signal, and converts a digital signal into an analog signal, and in particular to a codec of a single channel type comprising switched-capacitor filters, an analog-to-digital converter (an A/D converter) and a digital-to-analog converter (a D/A converter).

The codecs can be used, for example, being disposed in a digital terminal equipment, such as a digital telephone set, a digital PBX (private branch exchange) and a PCM multiplexer, connected to a communication network, for communication with another digital terminal equipment.

A conventional technology relating to a codec is shown in the following publication:
"Keys to design anti application of A/D and D/A converters" The First Edition (May 31, 1985); by Nihon Kogyou Gijutsu Center; pages 177 to 180.

Figure 6:
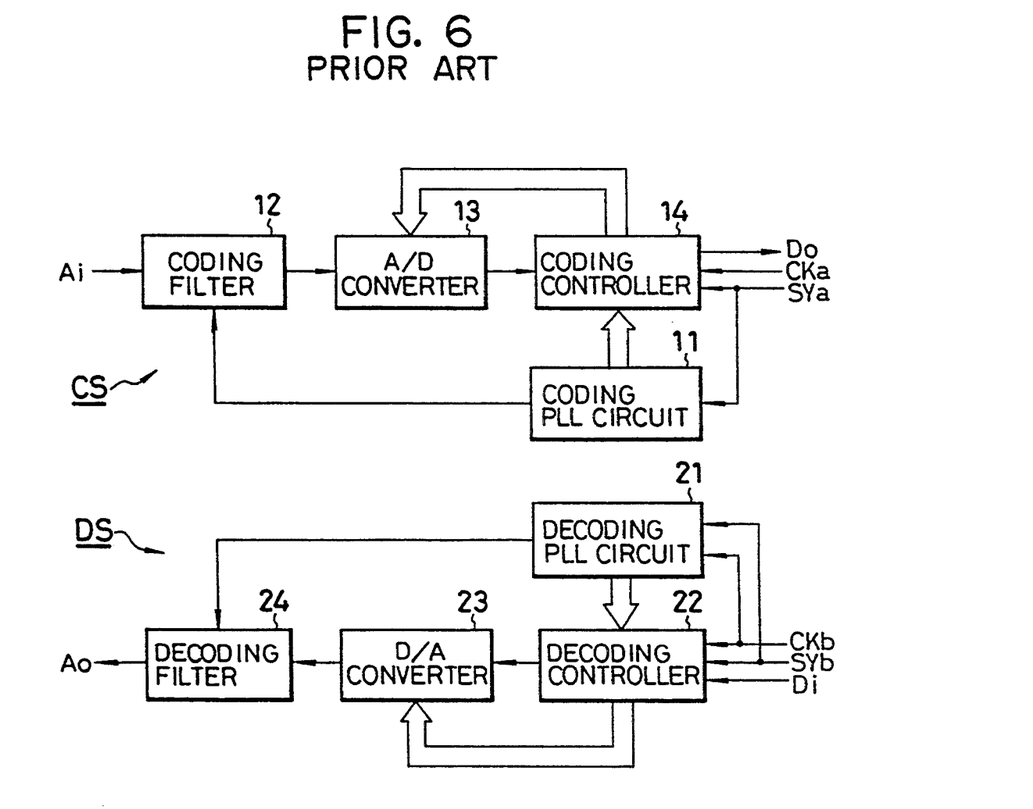
FIG. 6 is a block diagram of the configuration of the conventional codec.

FIG. 6 is a block diagram showing an example of a conventional codec shown in the above publication.

Provided at the coding section CS of the codec are a coding controller 14 which controls the coding section, a coding PLL (phase-locked loop) circuit 11 generating a plurality of high-speed clock signals on the basis of a coding sync signal SYa supplied from the outside, e.g., from a communication network, and a coding filter 12, which is configured of switched capacitors, filters an analog signal Ai, e.g., a speech signals input from the outside, e.g., from a transmitter part (microphone) of a telephone set, operating in synchronism with a high-speed clock signal supplied from the coding PLL circuit 11. An A/D converter 13 converts the output of the coding filter 12 into a digital signal in the form of parallel data, in synchronism with the high-speed clock signals supplied from the coding PLL circuit 11. The digital signal is then sent to the coding controller 14, which converts the parallel data from the A/D converter 13 into serial data Do. Each sample of the analog signal is digitized into a byte of digital signal consisting of eight bits. Each byte of the serial data Do of eight bits is then sent out, in synchronism with the coding clock signal CKa.

The coding controller 14 receives the coding sync signal SYa of 8 kHz, for example, which serves as a time reference for the sampling at the A/D converter 13, and the coding clock signal CKa used as a shift clock for determining the output speed or rate of the digital signal output, and controls the coding filter 12 and the A/D converter 18. The coding clock signal CKa is set at a frequency several times the coding sync signal SYa, and is normally within in the range off 64 kHz to 2048 kHz, and is determined in accordance with the terminal equipments that are connected to the communication network.

Provided at the decoding section DS of the codec are a decoding PLL circuit 21 for receiving a decoding sync signal SYb of a reference frequency supplied from the outside, e.g., from the communication network, and a decoding clock signal CKb, and a decoding controller 22 receiving the decoding sync signal SYb, the decoding clock signal CKb, and a digital signal Di in the form of serial data, from the communication network. Each byte of serial data consisting of eight bits is supplied in synchronism with each decoding sync signal SYb. The decoding sync signal SYb is used as a time reference for the D/A conversion at a D/A converter 23, and is set for example at 8 kHz. The decoding clock signal CKb has the same data speed as the input digital signal Di, and is used as a shift clock for inputting the digital signal into the codec, and is set at a frequency several times the frequency of the decoding sync signal SYb, and is normally within the range of 64 kHz to 2048 kHz, and is determined in accordance with the terminal equipments that are connected to the communication network.

The decoding PLL circuit 21 generates a plurality of high-speed clock signals on the basis of the decoding sync signal SYb supplied from the outside, e.g., from the communication network. The decoding controller 22 controls the decoding section, and reads the digital signal Di in the form of serial data, in synchronism with the decoding clock signal CKb, and converts the digital data in the form of serial data, into parallel data. The D/A converter 28 converts the digital signal, into an analog signal, in synchronism with the high-speed clock signal supplied from the decoding PLL circuit 21.

A decoding filter 24 is configured of switched capacitors, and operates in synchronism with the high-speed clock signal supplied from the decoding PLL circuit 21, to filter the output of the D/A converter 23, and outputs an output analog signal Ao.

The operation is next described.

When the coding clock signal CKa and the coding sync signal SYa are input to the coding section, the coding PLL circuit 11 and the coding controller 14 begin operating, and the coding filter 12, under the control by the coding controller 14, filters the analog signal Ai to be transmitted. The filtered analog signal is converted by the the A/D converter 13, also controlled by the coding controller 14, into a digital signal, and is sent to the coding controller 14. The coding controller 14 transmits the digital signal Do from the A/D converter 13 to the outside, in synchronism, with the coding clock signal CKa.

When the decoding clock signal CKb and the decoding sync signal SYb are input to the decoding section, the decoding controller 22 begins operating. The decoding controller 22 reads the digital signal Di in synchronism with the decoding clock signal CKb. When each byte of the digital signal Di has been read, the decoding PLL circuit 21 begins operating, and the D/A converter 23 and the decoding filter 24 are controlled by the outputs of the decoding PLL circuit 21. The D/A converter 23 converts the digital signal Di read by the decoding controller 22, into an analog signal. The analog signal is filtered by the decoding filter 24, and the filtered analog signal Ao is output.

As described above, the coding PLL circuit 11 begins operating when the coding sync signal SYa is input, and the decoding PLL circuit 21 begins operating when the digital data Di is read into the codec. Since the coding section and the decoding section operate with independent timings, the coding PLL circuit 11 and the decoding PLL circuits 21 are provided separately at the coding and decoding sections. With regard to the high-speed clock signals used for the coding filter 12 and the decoding filter 24, the clock signal for the coding filter 12 must be in synchronism with the A/D conversion, and the clock signal for the decoding filter 24 must be in synchronism with the D/A conversion. This is to avoid noises which occur when the clocks are asynchronous. For this reason, the clocks generated separately at the coding PLL circuit 11 and the decoding PLL circuit 21 are used in the respective circuits.

The codec of the above configuration has the following problems.

As a result of furtherance of synchronization of the communication systems, a common clock signal is often used for the coding clock signal CKa and the decoding clock signal CKb. However, with the conventional codec, even if a common signal is used for the coding and decoding clock signals CKa and CKb, and for the coding and decoding sync signals SYa and SYb, the operation timings at the coding and decoding sections differ depending on the frequency of the clocks, and it is therefore necessary to provide the separate coding PLL circuit 11 and decoding PLL circuit 21. This is because the codec must be so designed to operate with any of various clock frequencies as the devices in which the codec is incorporated may use different frequencies. For instance, digital telephone sets may use 64 kHz, PCM multiplexers may use 1544 kHz, and digital PBX may use 2048 kHz.

Where two PLL circuits 11 and 21 are present in the coding and decoding sections, the clock signal generated by the decoding PLL circuit 21 is an asynchronous clock as seen from the coding section, and the clock signal generated by the coding PLL circuit 11 is an asynchronous clock as seen from the decoding section. As a result, noises are increased, so that the S/N ratio (signal-to-noise ratio) is degraded. Moreover, the circuits of the coding PLL circuit 11 and the decoding PLL circuit 21 are complex and bulky, so where the codec is formed or implemented in a semiconductor integrated circuit, the area required on the integrated circuit chip is large, and the power consumption is large because of the oscillating function provided.

SUMMARY OF THE INVENTION

The invention provides a codec having solved the problems of the prior art, of the degradation of the S/N ratio due to asynchronous noises resulting from the two PLL circuits present in the codec, of the increase of the area of the chip occupied by the codec implemented in an integrated circuit, and of the increase of the power consumption.

To solve the problem discussed above, the invention provides a codec comprising:

a coding PLL circuit (30) for generating a plurality of clock signals (S30a, S30b) on the basis of a coding sync signal (SYa);

a coding filter (41) operating in synchronism with the output (S30b) of the coding PLL circuit (30) to filter an input analog signal (Ai);

an analog-to-digital converter (42) for converting the output of the coding filter into a digital signal;

a coding controller (48) for controlling the analog-to-digital converter (42) in synchronism with a common clock signal (CK), the coding sync signal (SYa) and the clock signal (S30a) generated by the coding PLL circuit (30), and outputting the digital signal (Do);

a decoding timing generating circuit (50) for generating a digital-to-analog conversion timing signal (S50) on the basis of the clock signal (S30b) generated by the coding PLL circuit (30) and a reading completion signal (S61a);

a decoding controller (61) receiving the common clock signal (CK) and a decoding sync signal (SYb), and reading a received digital signal (Di) in synchronism with the decoding sync signal (SYb) and the common clock signal (CK), and supplying the reading completion signal (S61a) to the decoding timing generating circuit (50);

a digital-to-analog converter (62) controlled by the decoding controller (61), and converting the received digital signal read by the decoding controller (61), into an analog signal, responsive to the digital-to-analog conversion timing signal (S50); and a decoding filter (63) operating in synchronism with the clock signal (S30b) generated by the coding PLL circuit (30) to filter the output of the digital-to-analog converter (62).

In the coding section (CS) of the codec of the above configuration, when the coding sync signal (SYa) is supplied to the coding PLL circuit (30), the coding PLL circuit (30) generates a plurality of clock signals (S30a, S30b), and supplies them to the coding filter (41), the decoding filter (63), and the decoding timing generating circuit (50). The coding filter (41) operates in synchronism with the clock signal supplied from the coding PLL circuit to filter the input analog signal, and the filtered analog signal is converted at the A/D converter (42) into a digital signal, and is output to the outside via the coding controller (43).

In the decoding section (DS), the decoding controller (61) reads the received digital signal (Di), and when the reading of each byte of digital data is completed, a reading completion signal (S61a) is supplied to the decoding timing generating circuit (50). The decoding timing generating circuit generates the D/A conversion timing signal (S50) on the basis of the clock signal (S30b) from the coding PLL circuit (30) and the reading completion signal (S61a). The D/A converter (62) converts the digital signal that has been read by the decoding controller (61), into an analog signal in synchronism with the D/A conversion timing signal (S50), and sends the analog signal to the decoding filter. The decoding filter operates in synchronism with the clock signal supplied from the coding PLL circuit to filter the output of the D/A converter, and outputs the filtered analog signal.

Thus, it is possible to generate clock signals of different timings for coding and decoding by means of a single coding PLL circuit, and the S/N ratio can be improved, and a codec which consumes less power and is suitable for implementation in an integrated circuit can be realized. Accordingly, the problems set forth above can be solved.

In an example of the decoding timing generating circuit, the output of the coding PLL circuit is counted and its count value is compared with a count value of a timing error counter. If they agree, a coincidence signal is produced. Responsive to this coincidence signal, and when the reading completion signal is turned Active, the D/A conversion timing signal is made Active. The D/A conversion timing signal is made Active only once each time the reading completion signal is turned Active. When the D/A conversion timing signal is produced concurrently while the reading completion signal is Active, a timing error signal is produced, and is counted by the timing error counter. This effectively retards the generation of the coincidence signal by one cycle of the clock, and the repetition of the generation of the D/A timing signal concurrent with the reading completion signal is avoided.

DETAILED DESCRIPTION OF THE PREFERRED EMBODIMENTS

An embodiment of the invention will be described with reference to FIG. 1. In describing the embodiment it is assumed at certain instances that the codec is incorporated in a telephone set connected to a digital communication network. The invention is equally applicable to codecs incorporated in a PCM multiplexer, a digital PBX or any other digital terminal equipment.

The illustrated codec comprises a coding section CS and a decoding section DS. The coding section CS comprises a coding filter 41, an A/D converter 42, a coding controller 43, and a coding PLL circuit 30.

The coding controller 43 controls the coding section, in particular the coding filter 41 and the A/D converter 42. The coding controller 43 also produces high-speed clock signals S43, which comprises a set of clocks at 8 kHz with different phases. The clock signal S43 is produced on the basis of the coding sync signal SYa.

The coding PLL circuit 30 generates a plurality of high-speed clock signals S30a and S30b, on the basis of a coding sync signal SYa of for example 8 kHz supplied from the outside, e.g., from the communication network. The clock signals S30a and S30b are in synchronism with the coding sync signal SYa, so that their frequencies are proportional to the coding sync signal SYa. The frequency of the clock signal S30b is 240 kHz, for example, while the clock signal S30a comprises a set of clocks of several different frequencies, such as 240 kHz, 120 kHz, 56 kHz, 32 kHz, 16 kHz and 8 kHz.

The coding filter 41, which is configured of switched capacitors, filters an analog signal Ai e.g., a speech signal input from the outside, e.g., through a transmitter part (microphone) of a telephone set, using as its clock, the high-speed clock signal S30b generated by and supplied from the coding PLL circuit 30.

The coding filter is a bandpass filter with a pass band of 300 to 3400 Hz for passage of analog speech signals and removable of noises.

The A/D converter 42 converts the output of the coding filter 41 into a digital signal in the form of eight-bit parallel data, in synchronism with the high-speed clock signal S43 supplied from the coding controller 43. More specifically, the A/D converter 42 samples the output of the coding filter 41, and converts each sample into a byte of digital data consisting of eight bits.

The A/D converter 42 is formed of a successive approximation A/D converter and requires a set of high-speed clocks with different phases.

The coding controller 43 receives the digital data from the A/D converter 42, and also receives the coding sync signal SYa and the common clock signal CK. The coding controller 43 converts the parallel data from the A/D converter 42 into serial data Do, and sends out the serial data Do in synchronism with the coding sync signal SYa and the common clock signal CK. That is, output or transmission of each byte of serial data is commenced responsive to a coding sync signal SYa, and each bit serial data is sent out in time with each pulse of the common clock.

Thus, the coding sync signal SYa serves as a time reference for the sampling at the A/D converter 42, while the common clock signal CK is used as a shift clock for determining the output speed or rate of the digital signal output.

The common clock signal CK is set at a frequency several times the coding sync signal SYa, and is normally within in the range of 64 kHz to 2048 kHz, and is determined in accordance with the terminal equipments that are connected to the communication network.

The decoding section DS of the codec comprises a decoding controller 61, a D/A converter 62 and a decoding filter 63, and a decoding timing generating circuit 50.

The decoding controller 61 receives the decoding sync signal SYb, the common clock signal CK, and a digital signal Di in the form of serial data, supplied from the outside, e.g., from the communication network. The decoding sync signal SYb is used as a time reference for the timing of D/A conversion, and is set for example at 8 kHz. The digital data Di is serial data which is input in synchronism with the decoding sync signal SYb and the common clock CK. That is, the head of the each byte of serial data is in time with the decoding sync signal SYb and each of digital data is supplied in time with each pulse of the common clock CK. Thus, the common clock CK is used as a shift clock for the input of the digital signal Di into the codec. This means that the digital data is supplied at the same bit rate as the frequency of the common clock CK.

The decoding controller 61 controls the decoding section, and in particular the D/A converter 62 and the decoding filter 63, and reads the digital signal Di in the form of serial data, at the timing of the common clock signal CK, and converts the digital data in the form of serial data, into parallel data. The decoding controller 61 produces the reading completion signal S61a, when a byte of serial data following each decoding sync signal SYb has been read into the decoding controller 61.

The decoding controller 61 also produces a high-speed clock signal S61b comprising a set of clocks having a frequency of 8 kHz and having different phases. The clock signal S61b is produced on the basis of the decoding sync signal SYb.

The decoding timing generating circuit 50 receives the reading completion signal S61a from the decoding controller 61 and generates a D/A conversion timing signal S50 on the basis of the clock signal S30b supplied from the coding PLL circuit 30 and the reading completion signal S61a.

The D/A converter 62 converts the digital signal, into an analog signal, in synchronism with the high-speed clock signal S61b.

The decoding filter 63 is configured of switched capacitors, and operates in synchronism with the high-speed clock signal S30b to filter tile output of the D/A converter 62, and outputs an output analog signal Ao, which is supplied to the outside, e.g., a receiver part of the telephone set. The decoding filter 63 is a low-pass filter with a pass band of 0 to 3400 Hz to remove noises of high frequencies.

Figure 2:
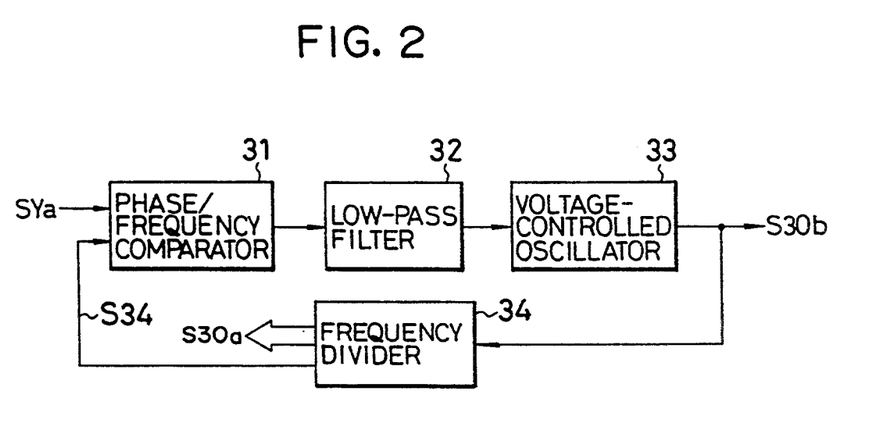
FIG. 2 is a block diagram showing the coding PLL circuit of FIG. 1.

FIG. 2 is a block diagram showing an example of configuration of the coding PLL circuit 30.

The coding PLL circuit 30 includes a phase/frequency comparator 31 for determining the phase difference between the coding sync signal SYa and a feedback signal S34, and a low-pass filter 32 filtering the output of the phase/frequency comparator 31 to remove high-frequency components, a voltage-controlled oscillator 33 receiving the output of the low-pass filter 32 and generating the clock signal S30b on the basis of the output of the low-pass filter 32, and a frequency divider 34 connected to the output of the voltage-controlled oscillator 33 and frequency-dividing the clock signal S30b to produce the signals S30a and S34. The frequency-divided signal S30a is output, while the frequency-divided signal S34 is applied to the phase/frequency comparator 31, as a feedback signal as described above.

Figure 1:
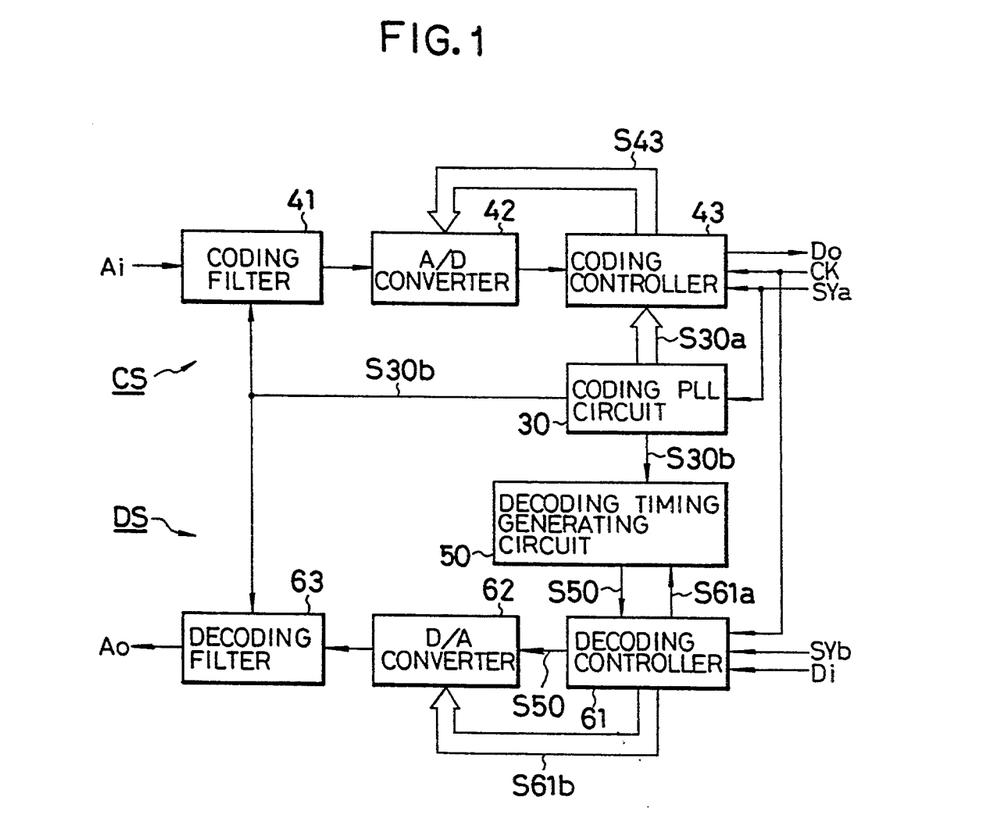
FIG. 1 is a block diagram showing the configuration of a codec of an embodiment of the invention.
Figure 3:
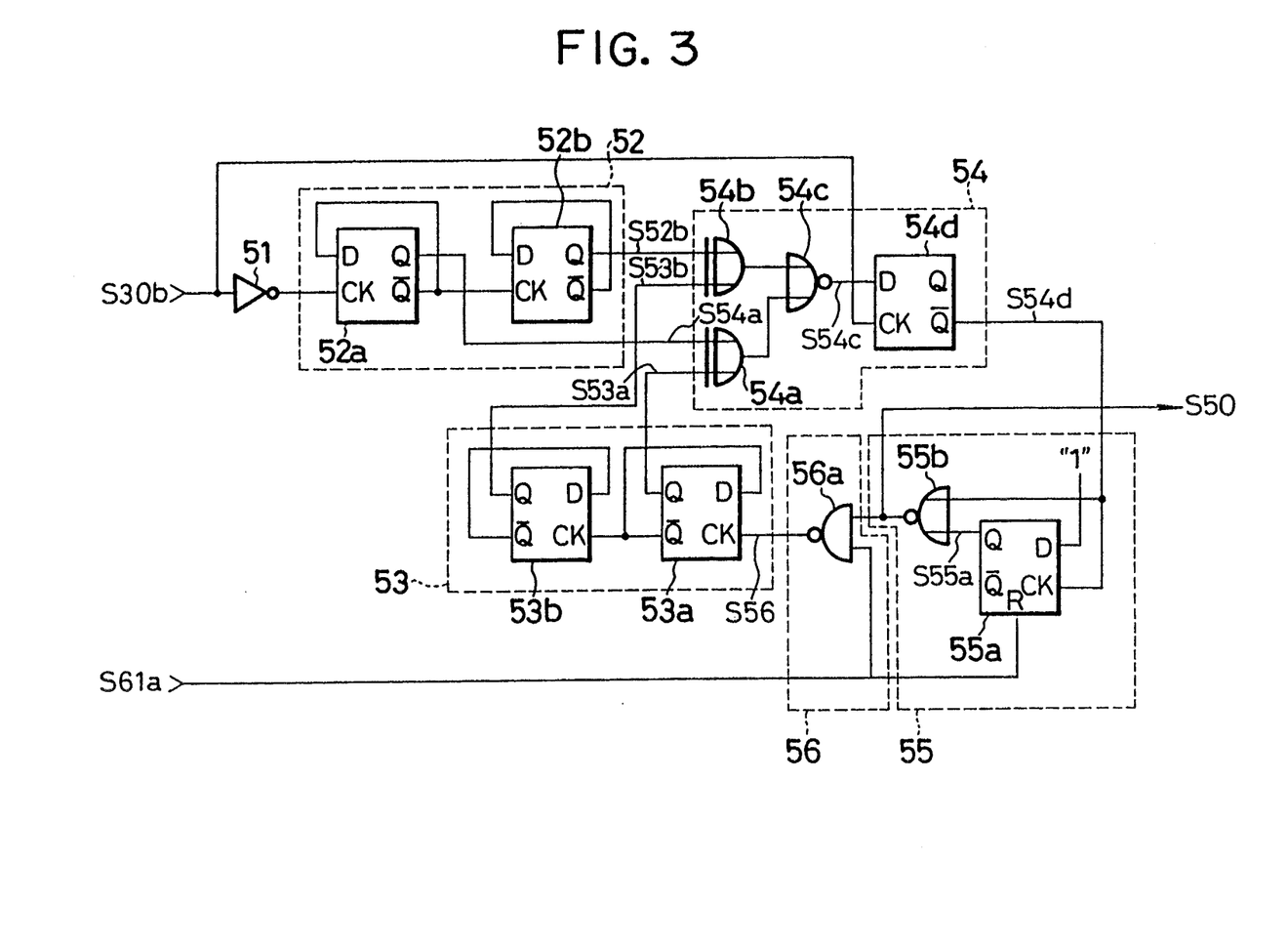
FIG. 3 is a circuit diagram showing the decoding timing generating circuit of FIG. 1.

FIG. 3 is a circuit diagram showing an example of configuration of the decoding timing generating circuit 50 of FIG. 1.

The decoding timing generating circuit 50 comprises an inverter 51, a clock counter 52, a timing error counter 53, a coincidence detecting circuit 54, a timing signal generating circuit 55 and a timing error detecting circuit 56.

The inverter 51 inverts the clock signal S30b from the coding PLL circuit 30.

The clock counter 52 is connected to the output of the inverter 51, and counts the clocks (S30b) as output from the inverter 51. The clock counter is formed of a two-bit counter comprising two-stage delay-type flip-flops (D-FFs) 52a and 52b to generate a count value represented by a combination of outputs S52a and S52b. The clock count value as represented by the outputs S52b and S52a cyclically changes in the sequence of "00", "01", "10", "11" and then to "00". It is to be noted that the output S52b represents the higher bit while the output S52a represents the lower bit. The clock counter can also be regarded as a frequency divider wherein the frequency of the output S52a is one half the frequency of the output of the inverter 51, and the frequency of the output S52b is a quarter of the frequency of the inverter 51.

The timing error counter 53 is formed of two-stage D-FFs 53a and 53b, and counts timing error signals S56 which are generated each time a timing error is detected. The error count value as represented by two-bit outputs S53b and S53a cyclically changes in the sequence of "00", "01", "10", "11" and then to "00". It is to be noted that the output S53b represents the higher bit while the output S53a represents the lower bit.

The coincidence circuit 54 detects coincidence between the outputs S52a and S52b of the clock counter 52 and the outputs S53a and S53b of the error counter 53, and outputs a Low ("0") output S54d when the coincidence is found both between the outputs S52a and S53a, and between the outputs S52b and S53b. That is, the output S54d of the coincidence circuit 54 is Low when it is Active. The output S54d is also called a coincidence signal.

The coincidence circuit 54 comprises an exclusive-OR gate (EOR gate) 54a receiving the outputs S52a and S53a, another EOR gate 54b receiving the outputs S52b and S53b, a NOR gate 54c receiving the outputs of the EOR gates 54a and 54b, and a D-FF 54d receiving at its data terminal (D) the output of the NOR gate 54d and receiving at its clock terminal (CK) the clock S30b, for producing a signal S54d which goes Low and then High in time with the clock S30b, when coincidence is found. In other words, the D-FF 54d temporarily holds the output of the NOR gate 54c.

The timing signal generating circuit 55 comprises a resettable D-FF (D-FF with a reset terminal) 55a receiving at its data terminal (D) a fixed signal indicating "1" or High, receiving at its clock terminal (CK) the output S54d of the D-FF 54, and receiving at its reset terminal (R) the reading completion signal S61a, and a NOR gate 55b receiving the output S54d and the Q outpost of the D-FF 55a, and determining an inversion of the logical sum of the output S55a and the output S54d. The output of the NOR gate 55b is the D/A conversion timing signal S50.

The timing error detecting circuit 56 comprises a NAND gate 56a which determines an inversion of the logical product of the timing signal S50 and the reading completion signal S61a thereby to detect the timing error, and generates the timing error signal S56 each time a timing error is found, i.e., the D/A conversion signal S50 and the reading completion signal S61a are concurrently supplied, i.e., are concurrently made Active.

Figure 4:
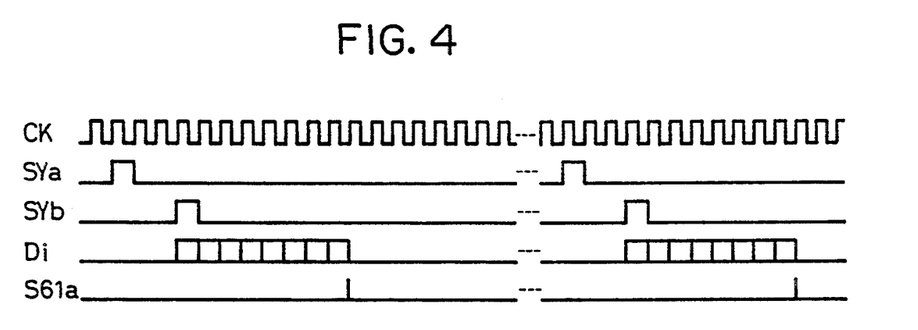
FIG. 4 and FIG. 5 are time charts showing the operation of the circuits of FIG. 1 and FIG. 3.

The operation of the entire codec of FIG. 1 will be first described with reference to FIG. 4.

The coding sync signal SYa is input to the coding PLL circuit 30 and the coding controller 43, while the common clock signal CK is input to the coding controller 43 and the decoding controller 61, and the decoding sync signal SYb is input to the decoding controller 61. The high-speed clock signals S30a and S30b are generated at the coding PLL circuit 30 on the basis of the coding sync signal SYa, and the clock signals S30a is supplied to the coding controller 43, the clock signal S30b is supplied to the coding filter 41, the decoding filter 63 and the decoding timing generating circuit 50. The clock signal S43 is generated at the coding controller 43 on the basis of the coding sync signal SYa, and is supplied to the A/D converter 42. The clock signal S61b is generated at the decoding controller 61 on the basis of the decoding sync signal SYb, and is supplied to the D/A converter 62.

An input analog signal Ai is filtered at the coding filter 41, operating in synchronism with the clock signal S30b. The filtered signal is A/D converted into a digital signal in the form of eight-bit parallel data, at the A/D converter 42, operating in synchronism with the clock signal S43. The digital signal Do in the form of parallel data is converted into serial data, at the coding controller 43, and is sent out to the communication network not shown, in synchronism with tile coding sync signal SYa and the common clock signal CK. That is, the commencement of each byte of serial data takes place in time with a coding sync signal SYa, and each bit is sent out in time with each pulse of the common clock CK.

Digital data Di is transmitted via the communication network not shown is applied to the decoding controller 61. Each byte of serial data is applied in synchronism with the decoding sync signal SYb and the common clock CK. That is, the head of each byte of serial data is in time with the decoding sync signal SYb and each bit is in time with each pulse of the common clock CK.

The applied digital data is read by the decoding controller 61, in synchronism with the decoding sync signal SYb and the common clock CK, and is converted into a digital signal in the form of parallel data, and sent to the D/A converter 62, for D/A conversion.

When reading of each byte of serial data is completed, the reading completion signal S61a is generated by the decoding controller 61., and is supplied to the decoding timing generating circuit 50. The D/A conversion timing signal S50 is then generated by the decoding timing generating circuit 50. The expression "the reading completion signal S61a is generated or supplied" is used to mean that the reading completion signal S61 is made Active, which is High in the illustrated example. Similarly, the expression "the D/A conversion timing signal S50 is generated or supplied" is used to mean that the D/A conversion timing signal S50 is made Active, which is High in the illustrated example.

The D/A conversion timing signal S50 should be generated at a timing which satisfies the following conditions:

(a) The D/A conversion timing signal S50 should be generated at a specific timing with respect to the clock signal S30b supplied to the decoding filter 63. This condition must be met in order to eliminate noises due to lack of synchronism between the D/A conversion and the operation of the switching of the capacitors in the decoding filter 63.

(b) The D/A conversion timing signal S50 should be generated after and as soon as the reading of each byte of serial data is completed, i.e., the reading completion signal S61a is generated.

To satisfy the conditions set forth above, the D/A conversion timing signal S50 is generated in the decoding timing generating circuit 50, on the basis of the clock signal S30b and the reading completion signal S61a, in a manner later described in detail, and applied via the decoding controller 61 to the D/A converter 62.

The digital data from the decoding controller 61 is D/A converted into an analog signal at the D/A converter 62 converter, operating in synchronism with the D/A conversion timing signal S50 as well as the clock signal S61b. The analog signal is filtered at the decoding filter 63 operating in synchronism with the clock signal S30b, and is then sent out as an Output analog signal Ao to the outside, e.g., to a receiver part of a telephone set, not shown.

The operation of the decoding timing generating circuit 50 is next described with reference to FIG. 5.

When the clock signal S30b supplied from the coding PLL circuit 30 is input to the decoding timing generating circuit 50, and the clock counter 52 supplies the outputs S52a and S52b to the coincidence circuit 54. The output S54c of the NOR gate 54c is "1" (High or Active) when the outputs S52a and S53a agree and at the same time the outputs S52b and S53b agree. If the outputs of the error counter 53 are unchanged, the coincidence is found every 4 cycles of the clock S30b and lasts for one cycle of the clock S30b. Thus, the NOR gate 54c finds coincidence on the basis of the outputs S52a, S52b, S53a and S53b. The coincidence signal S54d at the output of the coincidence circuit 54 goes Low or is turned Active when the clock S30b rises while the output S54c is High, and goes High or is turned Inactive when the clock S30b rises while the output S54c is Low. That is, the rise and fall of the coincidence signal S54d are coincident with the rising edges of the clock S30b and which is produced when (and a little after) the coincidence is found.

Responsive to the coincidence signal S54d, and also to the reading completion signal S61a, the timing signal generating circuit 55 generates the D/A conversion timing signal S50 when the reading completion signal S61a is supplied or is turned Active, and when the coincidence signal S54d is Low. Specifically, the timing signal S50 is generated when the reading completion signal S61a and the coincidence signal S54d are both Active. It is not required that the reading completion signal S61a and the coincidence signal S54d are Active exactly concurrently. The timing signal S50 is generated only once each time the reading completion signal S61a is supplied. The timing signal S50 goes High when the coincidence signal S54d goes Low (Active) after the reading completion signal S61a is supplied, or when the reading completion signal S61a goes High while the coincidence signal S54d is Low (Active). The timing signal S50 goes Low when the coincidence signal S54d goes High.

Specifically, the Q output S55a of the resettable D-FF 55a goes Low when the reading completion signal S61a is supplied, and goes High when the coincidence signal S54d rises subsequently (after the reading completion signal S61a is turned Inactive). The signal S50 at the output of the NOR gate 55b is High when the Q output S55a is Low and the coincidence signal S54d is also Low. Accordingly, the signal S50 goes High when the coincidence signal S54d of the coincidence circuit 54 goes Low while the Q output S55a of the D-FF 55a is Low, i.e., after the reading completion signal S61a is applied to the D-FF 55a, or when the reading completion signal S61a goes High while the coincidence signal S54d is Low. The signal S50 goes Low when the coincidence signal S54d goes High, i.e., when the clock S30b rises after the coincidence is no longer present.

The output S56 of the timing error detecting circuit 56 goes Low (Active) when the timing signal S50 and the reading completion signal S61a are both High. The timing signal S50 should desirably goes High after the reading completion signal S61a goes Low, as described before. If the timing signal S50 goes High while the reading completion signal S61a is High, the generation of the timing signal S50 is too early, and should be delayed or retarded. Such retardation is achieved by the function of the error counter 53 and the coincidence circuit 54. That is, when the output S56 of the timing error detecting circuit 56 goes Low, the count value of the error counter is incremented by "one". As a result, the time at which the coincidence is found is delayed by one cycle of the clock S30b, because the count value of the clock counter 52 is incremented one by one every cycle of the clock S30b.

Assume, for instance, that the count value of the error counter 53 is initially "00", and the coincidence circuit 54 produces a coincidence signal in time with a first one of four consecutive clocks-S30b. If the count value of the error counter is changed to "01" (with the Q output S53a of the D-FF 53a being "1" or High, while the Q output S53b of the D-FF 53b being "0" or Low), then the coincidence circuit 54 produces the coincidence signal in time with a second one of the four consecutive cycles of the clocks S30b, one cycle behind the above-mentioned first one of the four consecutive cycles. If the count value of the error counter is changed to "10" (with the Q output S53a off the D-FF 53a being "0" or Low, while the Q output S53b of the D-FF 53b being "1" or High), then the coincidence circuit 54 produces the coincidence signal in time with a third one of the four consecutive cycles of the clocks S30b, two cycles behind the above-mentioned first one of the four consecutive cycles. If the count value of the error counter is changed to "11" (with the Q outputs S53a and S53b of the D-FFs 53a and 53b being both "1" or High), then the coincidence circuit 54 produces the coincidence signal in time with a fourth one of the four consecutive cycles of the clocks S30b, three cycles behind the above-mentioned first one of the four consecutive cycles. Further retardation is not possible with the illustrated circuit, but is not required provided that the pulse width of the reading completion signal S61a is not unduly wide. If the duration of the reading completion signal S61a is not longer than one cycle of the clocks S30b, both of the counters 52 and 53 need not be a two-bit counter but may be a one-bit counter in which case the coincidence circuit produces a coincidence signal every alternate cycles of the clocks S30b. But to provide a time margin to allow for a time shift or elongation of the duration of the reading completion signal S61a, it is desirable to use the two-bit counters.

Figure 5:
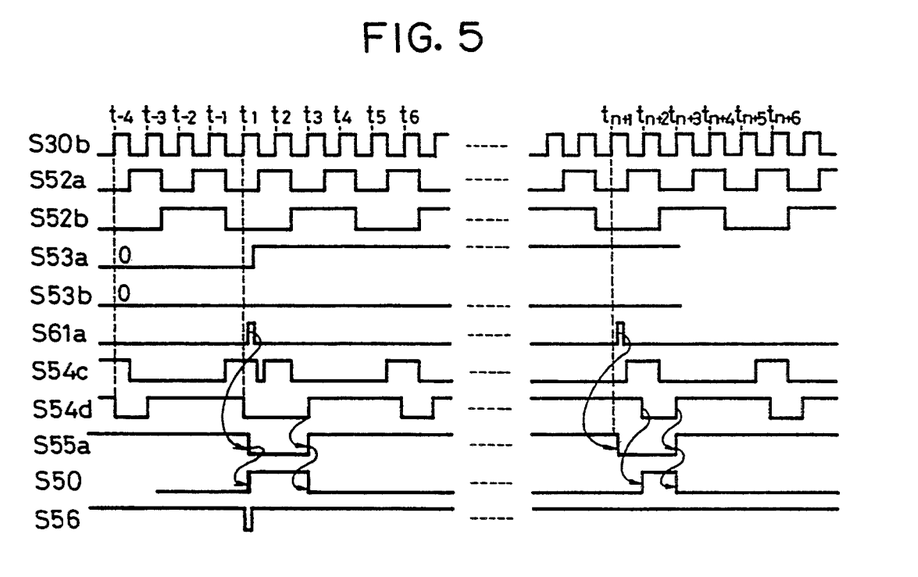

Referring to FIG. 5, at time points $t_{-4}, t_{-3}, t_{-2}, t_{-1}, t_1, t_2, t_3, \ldots, t_{n+1}, t_{n+2}, t_{n+3}, \ldots$, the clock signal S30b is input from the coding PLL circuit 30, and its inversion is counted by the clock counter 52, and the outputs S52a and S52b of the respective bits are applied to the coincidence circuit 54. Assume that at the beginning the outputs S53b and S53a of the error counter 53 are "00". The coincidence signal S54d is produced at the time points $t_{-4}$ and $t_1$. At time point $t_1$, the reading completion signal S61a is supplied, while the coincidence signal S54d is Low (Active), so the timing error signal S56 is generated, and the count value of the error counter 53 is incremented by one to become "01". After this, the coincidence circuit 54 provides the coincidence signal S54d when the outputs S52b and S52a of the clock counter 52 are "01".

At the time point $T_{n+1}$ when the reading completion signal S61a is supplied, the coincidence signal S54d is not produced (not Low), so the timing error signal S56 is not produced, and the count value of the error counter 53 is unchanged, and held at "01".

By using the D/A conversion timing signal S50 to trigger or time D/A conversion at the D/A converter 62, the D/A conversion is achieved in synchronism with the operation of the switched-capacitor decoding filter 63, so noises due to lack of synchronism can be prevented.

In addition, the operation of the D/A converter 62 and the decoding filter 63 in the decoding section DS is in synchronism with the operation of the coding filter 41 and the A/D converter 42 in the coding section CS, so that it is possible to prevent noises which may occur if the coding section CS and the operation of the decoding section DS operate asynchronously.

As has been described, in the above embodiment, in place of the conventional decoding PLL circuit, the decoding timing generating circuit 50 is provided, and the high-speed clock signal S30b for the coding filter 41 and the decoding filter 63 is supplied from the coding PLL circuit 30. That is, only the single PLL circuit 30 is used to generate the timing clock signals of different timings for coding and decoding. As a result, degradation of the S/N ratio due to the interference of the asynchronous clocks can be prevented. Moreover, the decoding timing generating circuit 50 is smaller in size than the conventional decoding PLL circuit, so that where the circuit is implemented in an integrated circuit, the area of the chip occupied can be reduced, and the power consumption can be reduced.

The invention is not limited to the above embodiment, and various modifications are possible. For instance, the frequency of the common clock signal CK and the like can be set at different values, and the coding PLL circuit 30 and the decoding timing generating circuit 50 may be of configurations other than those shown in FIG. 2 and FIG. 3.

Although codecs of the invention are designed primarily for incorporation in a digital terminal equipment connected with a digital communication network, they can also be used for incorporation in other devices. For instance, they can be used in a recorder, such as a speech recorder, in which an input analog signal is digitized and then stored in a digital memory, and played back by reading the digital signal from the digital memory and converting it into an analog signal.

What is claimed is:

1. A codec comprising:
   a coding PLL circuit for generating a plurality of clock signals on the basis of a coding sync signal;
   a coding filter operating in synchronism with the output of said coding PLL circuit to filter an input analog signal;
   an analog-to-digital converter for converting the output of the coding filter into a digital signal;
   a coding controller for controlling said analog-to-digital converter in synchronism with a common clock signal, said coding sync signal and said clock signal generated by said coding PLL circuit, and outputting said digital signal;
   a decoding timing generating circuit for generating a digital-to-analog conversion timing signal on the basis of said clock signal generated by said coding PLL circuit and a reading completion signal;
   a decoding controller receiving said common clock signal and a decoding sync signal, and reading a digital signal in synchronism with said decoding sync signal and said common clock signal, and supplying said reading completion signal to said decoding timing generating circuit;
   a digital-to-analog converter controlled by said decoding controller, and converting said received digital signal read by said decoding controller, into an analog signal, responsive to said digital-to-analog conversion timing signal; and
   a decoding filter operating in synchronism with said clock signal generated by said coding PLL circuit to filter the output of said digital-to-analog converter.

2. A codec according to the claim 1, wherein said decoding timing generating circuit comprises:
   a clock counter for counting said clocks generated by said coding PLL circuit to produce an output indicating a clock count;
   a timing error counter for counting timing error signals to produce an output indicating an error count;
   a coincidence detecting circuit for detecting coincidence between said clock count and said error count and producing a coincidence signal when the coincidence is found;
   a timing signal generating circuit generating a timing signal on the basis of said coincidence signal and said reading completion signal; and
   a timing error detecting circuit for detecting a timing error on the basis of the reading completion signal and said timing signal, and outputting said timing error signal.

3. A codec according to the claim 2, wherein said timing signal generating circuit generates said timing signal when said coincidence signal is Active and when said reading completion signal is Active, with the timing signal being generated only once each time the reading completion signal is made Active.

4. A codec according to the claim 3, wherein said timing signal is turned Active when said coincidence signal is turned Active after said reading completion signal is Active, or when the reading completion signal is turned Active while the coincidence signal is Active, and is turned Inactive when the coincidence signal is turned Inactive.

5. A codec according to the claim 4, wherein the timing signal generating circuit comprises:
- a flip-flop connected to be reset responsive to said reading completion signal and to be set responsive to said coincidence signal, and
- a logic gate whose output is Active when said flip-flop is in the reset state and at the same time said coincidence signal is Active,
- the output of said logic gate being used as said timing signal.

6. A codec according to claim 1, wherein said timing signal is generated at a predetermined timing with respect to the clock with which said decoding filter operates.

7. A codec comprising:
- a PLL circuit for generating a plurality of clock signals on the basis of one of a plurality of sync signals;
- a first filter operating in synchronism with the output of said PLL circuit to filter an analog signal;
- an analog-to-digital converter for converting the output of the first filter into a digital signal;
- a first controller for controlling said analog-to-digital converter in synchronism with a common clock signal and said one sync signal, and outputting said digital signal;
- a timing generating circuit for generating a conversion timing signal on the basis of said clock signal generated by said PLL circuit and an enabling signal;
- a second controller for reading a digital signal in synchronism with said one sync signal and said common clock signal;
- a digital-to-analog converter for converting said received digital signal read by said second controller, into an analog signal;
- said second controller controlling said digital-to-analog converter in synchronism with said sync signal; and
- a second filter operating in synchronism with said clock signal generated by said PLL circuit to filter the output of said digital-to-analog converter, wherein one of said first and second controllers controls the corresponding converter by supplying said enabling signal to the timing generating circuit.

8. A codec according to claim 7, wherein said timing generating circuit comprises:
- a clock counter for counting said clocks generated by said PLL circuit to produce an output indicating a clock count;
- a timing error counter for counting timing error signals to produce an output indicating an error count;
- a coincidence detecting circuit for detecting coincidence between said clock count and said error count and producing a coincidence signal when the coincidence is found;
- a timing signal generating circuit generating a timing signal on the basis of said coincidence signal and said enabling signal; and
- a timing error detecting circuit for detecting a timing error on the basis of the enabling signal and said timing signal, and outputting said timing error signal.

9. A codec according to claim 8, wherein said timing signal generating circuit generates said timing signal when said coincidence signal is Active and when said enabling signal is Active, the timing signal being generating only once each time the enabling signal is made Active.

10. A codec according to claim 9, wherein said timing signal is turned Active when said coincidence signal is turned Active after said enabling signal is Active, or when the enabling signal is turned Active while the coincidence signal is Active, and is turned Inactive when the coincidence signal is turned Inactive.

11. A codec according to claim 10, wherein the timing signal generating circuit comprises:
- a flip-flop connected to be reset responsive to said enabling signal and to set responsive to said coincidence signal, and
- a logic gate whose output is Active when said flip-flop is in the reset state and at the same time said coincidence signal is Active, the output of said logic gate being used as said timing signal.

12. A codec according to claim 7, wherein said timing signal is generated at a predetermined timing with respect to the clock with which said second filter operates.

* * * * *